United States Patent
Wu et al.

(10) Patent No.: US 12,234,382 B2
(45) Date of Patent: Feb. 25, 2025

(54) CMP COMPOSITION INCLUDING ANIONIC AND CATIONIC INHIBITORS

(71) Applicant: CMC Materials, Inc., Aurora, IL (US)

(72) Inventors: Hsin-Yen Wu, Kaohsiung (TW); Jin-Hao Jhang, Taichung (TW); Cheng-Yuan Ko, Kaohsiung (TW)

(73) Assignee: CMC Materials LLC, Aurora, IL (US)

( * ) Notice: Subject to any disclaimer, the term of this patent is extended or adjusted under 35 U.S.C. 154(b) by 377 days.

(21) Appl. No.: 17/384,940

(22) Filed: Jul. 26, 2021

(65) Prior Publication Data

US 2022/0033682 A1    Feb. 3, 2022

Related U.S. Application Data

(60) Provisional application No. 63/077,036, filed on Sep. 11, 2020, provisional application No. 63/057,639, filed on Jul. 28, 2020.

(51) Int. Cl.
| | |
|---|---|
| C09G 1/02 | (2006.01) |
| C09K 3/14 | (2006.01) |
| C09K 13/00 | (2006.01) |
| H01L 21/321 | (2006.01) |
| H01L 21/768 | (2006.01) |

(52) U.S. Cl.
CPC .............. *C09G 1/02* (2013.01); *C09K 3/1409* (2013.01); *C09K 13/00* (2013.01); *H01L 21/3212* (2013.01); *H01L 21/7684* (2013.01)

(58) Field of Classification Search
None
See application file for complete search history.

(56) References Cited

U.S. PATENT DOCUMENTS

| | | | |
|---|---|---|---|
| 6,899,821 B2 | 5/2005 | Uchida et al. | |
| 9,567,490 B2 | 2/2017 | Jung | |
| 10,037,894 B2 | 7/2018 | Ichige et al. | |
| 2009/0081927 A1* | 3/2009 | Grumbine | C09K 3/1436 |
| | | | 451/36 |
| 2009/0239380 A1 | 9/2009 | Tomiga et al. | |
| 2010/0207057 A1 | 8/2010 | Nitta | |
| 2014/0024216 A1 | 1/2014 | Stender | |
| 2015/0083689 A1* | 3/2015 | Pallikkara Kuttiatoor | |
| | | | C09G 1/02 |
| | | | 252/79.4 |
| 2015/0221521 A1* | 8/2015 | Hou | H01L 21/31058 |
| | | | 438/693 |
| 2015/0344738 A1* | 12/2015 | Onishi | B24B 37/044 |
| | | | 438/692 |
| 2016/0107289 A1* | 4/2016 | Cavanaugh | H01L 21/3212 |
| | | | 252/79.1 |
| 2017/0107404 A1* | 4/2017 | Kim | C09G 1/02 |
| 2019/0051537 A1 | 2/2019 | Peng et al. | |
| 2019/0085205 A1 | 3/2019 | Chien et al. | |
| 2019/0100677 A1* | 4/2019 | Cui | C09G 1/02 |
| 2019/0211227 A1 | 7/2019 | Dockery et al. | |
| 2019/0301028 A1 | 10/2019 | Chen | |
| 2020/0211856 A1* | 7/2020 | Wada | C09K 13/08 |
| 2020/0283555 A1* | 9/2020 | Hsu | C08F 2/001 |
| 2021/0104411 A1* | 4/2021 | Chung | H01L 21/30604 |
| 2022/0017821 A1* | 1/2022 | Asirvatham | H01L 31/02363 |

FOREIGN PATENT DOCUMENTS

| | | |
|---|---|---|
| JP | 2009147278 A | 7/2009 |
| JP | 2009260304 A | 11/2009 |
| JP | 2014060250 A | 4/2014 |
| JP | 2014229827 A | 12/2014 |
| JP | 2016030831 A | 3/2016 |
| JP | 2018049992 A | 3/2018 |
| JP | 2018092960 A | 6/2018 |
| JP | 2019036714 A | 3/2019 |
| KR | 20190017648 A | 2/2019 |
| KR | 1020190072254 A | 6/2019 |
| WO | 2009098951 A1 | 8/2009 |

OTHER PUBLICATIONS

Korean Intellectual Property Office Acting as ISA, International Search Report and Written Opinion of the International Searching Authority issued in connection with Application No. PCT/US2021/043117 on Nov. 17, 2021.

Taiwan Intellectual Property Office, Search Report issued in connection with Application No. 110127281 on Jan. 3, 2023.

Jiang, Liang, Microelectronic Engineering., "Synergetic effect of H2O2 and glycine on cobalt CMP in weakly alkaline slurry", vol. 122., pp. 82-86., 2014.

\* cited by examiner

*Primary Examiner* — Allan W. Olsen

(57) ABSTRACT

A chemical mechanical polishing composition for polishing tungsten or molybdenum comprises, consists essentially of, or consists of a water based liquid carrier, abrasive particles dispersed in the liquid carrier, an amino acid selected from the group consisting of arginine, histidine, cysteine, lysine, and mixtures thereof, an anionic polymer or an anionic surfactant, and an optional amino acid surfactant. A method for chemical mechanical polishing a substrate including a tungsten layer or a molybdenum layer includes contacting the substrate with the above described polishing composition, moving the polishing composition relative to the substrate, and abrading the substrate to remove a portion of the tungsten layer or the molybdenum layer from the substrate and thereby polish the substrate.

13 Claims, No Drawings

CMP COMPOSITION INCLUDING ANIONIC AND CATIONIC INHIBITORS

CROSS-REFERENCE TO RELATED APPLICATIONS

This application claims the benefit of U.S. Provisional Application Ser. No. 63/057,639 entitled Molybdenum CMP Composition and Method Including Dual Inhibitors, filed Jul. 28, 2020 and U.S. Provisional Application Ser. No. 63/077,036 entitled Molybdenum CMP Composition and Method Including Dual Inhibitors, filed Sep. 11, 2020.

FIELD OF THE INVENTION

The disclosed embodiments relate to chemical mechanical polishing of metal layers and more particularly relate to compositions and methods for polishing tungsten and/or molybdenum.

BACKGROUND OF THE INVENTION

A number of chemical-mechanical polishing (CMP) operations are used in both front-end-of-the-line (FEOL) and back-end-of-the-line (BEOL) processing of semiconductor devices. For example, shallow trench isolation (STI) is an FEOL process used prior to forming the transistors to create a pattern of inlaid tetraethyl orthosilicate (TEOS) in the silicon wafer. Tungsten plug and interconnect and copper interconnect and dual damascene processes are BEOL processes used to create the network of metal wires that connect the device transistors. In these processes metal layers are deposited in openings formed in a dielectric material (e.g., TEOS). CMP is used to remove the excess metal from the dielectric and thereby form conductive plugs and/or interconnects therein.

As transistor sizes continue to shrink, the use of conventional interconnect technology has become increasingly challenging. Recently, molybdenum has emerged as a candidate metal for advanced node applications, for example, to replace copper and/or tungsten in the lower metal layers of the BEOL interconnect structure (e.g., in the M1, M2, and/or M3 layers). With the potential introduction of molybdenum as a plug and interconnect metal, there is an emerging need for CMP slurries that are able to planarize molybdenum containing substrates.

Chemical mechanical polishing compositions commonly employ an oxidizer such as hydrogen peroxide that can be chemically aggressive to the polished metal. Advanced node devices are generally highly susceptible to corrosion issues owing to the extremely small feature size of the metal structures. Tungsten and molybdenum both tend to be susceptible to hydrogen peroxide induced corrosion. There is a need for CMP slurries that can remove tungsten and/or molybdenum films and effectively planarize tungsten and/or molybdenum containing substrates while not causing corresponding corrosion.

BRIEF SUMMARY OF THE INVENTION

A chemical mechanical polishing composition for polishing a substrate having a tungsten or molybdenum layer is disclosed. The polishing composition comprises, consists essentially of, or consists of a water based liquid carrier, abrasive particles dispersed in the liquid carrier, an amino acid selected from the group consisting of arginine, histidine, cysteine, lysine, and mixtures thereof, and an anionic polymer or an anionic surfactant. A method for chemical mechanical polishing a substrate including a tungsten or molybdenum layer is further disclosed. The method may include contacting the substrate with the above described polishing composition, moving the polishing composition relative to the substrate, and abrading the substrate to remove a portion of the molybdenum layer from the substrate and thereby polish the substrate.

DETAILED DESCRIPTION OF THE INVENTION

Chemical mechanical polishing compositions are disclosed. The polishing composition comprises, consists essentially of, or consists of a water based liquid carrier, abrasive particles dispersed in the liquid carrier, an amino acid selected from the group consisting of arginine, histidine, cysteine, lysine, and mixtures thereof, and an anionic polymer or an anionic surfactant. Optional embodiments may further include an amino acid surfactant. In one preferred embodiment, the abrasive particles comprise anionic silica and/or anionic alumina; the amino acid is selected from the group consisting of arginine, histidine, and mixtures thereof, the anionic surfactant includes an alkyl group and a negative charged sulfate or sulfonate group; and the composition optionally further includes an amino acid surfactant including an amino acid group selected from the group consisting of glycine, alanine, arginine, histidine, lysine, aspartic acid, and glutamic acid. Disclosed compositions may further optionally include an iron-containing accelerator, a stabilizer bound to the iron-containing accelerator, and have a pH in a range from about 1.0 to about 5.0.

The disclosed compositions and methods may provide various technical advantages and improvements over the prior art. For example, disclosed compositions may provide improved inhibition of tungsten and/or molybdenum corrosion and etching and may further provide suitably high removal rates. These compositions may therefore advantageously provide improved patterned wafer polishing performance (e.g., improved dishing and array erosion) and may therefore enable tungsten and molybdenum CMP operations in advanced node devices.

It will be appreciated that the disclosed CMP compositions may be advantageously utilized for metal or dielectric CMP operations in which a tungsten or molybdenum layer is exposed to the polishing composition. The disclosed compositions may be particularly well suited for bulk removal and/or buff CMP operations (which are sometimes referred to in the art as first and second step CMP operations). As is known to those of skill in the art, bulk removal operations may require higher removal rates while buff operations may require lower defect levels. The disclosed CMP compositions may also be advantageously utilized for single step CMP operations.

The polishing composition contains abrasive particles suspended in a liquid carrier. The liquid carrier is used to facilitate the application of the abrasive particles and any optional chemical additives to the surface of the substrate to be polished (e.g., planarized). The liquid carrier may be any suitable carrier (e.g., a solvent) including lower alcohols (e.g., methanol, ethanol, etc.), ethers (e.g., dioxane, tetrahydrofuran, etc.), water, and mixtures thereof. Preferably, the liquid carrier comprises, consists essentially of, or consists of water, more preferably deionized water.

The abrasive particles that are suspended in the liquid carrier may include substantially any suitable abrasive material such as metal oxide particles, diamond particles, and/or ceramic particles. Metal oxide particles may include, for example, silica, ceria, and/or alumina abrasive particles including colloidal and/or fumed metal oxide particles. Ceramic particles may include materials such as cubic boron nitride or silicon carbide. As described in more detail below, preferred embodiments may include anionic colloidal silica particles, anionic alumina particles, or mixtures thereof.

In certain embodiments (such as in many of the Examples described below), the abrasive particles may include colloidal silica. As used herein the term colloidal silica particles refers to silica particles that are prepared via a wet process rather than a pyrogenic or flame hydrolysis process which produces structurally different particles. The colloidal silica particles may be aggregated or non-aggregated. Non-aggregated particles are individually discrete particles that may be spherical or nearly spherical in shape, but can have other shapes as well (such as generally elliptical, square, or rectangular cross-sections). Aggregated particles are particles in which multiple discrete particles are clustered or bonded together to form aggregates having generally irregular shapes. Aggregated colloidal silica particles are disclosed, for example, in commonly assigned U.S. Pat. No. 9,309,442.

The abrasive particles may have substantially any suitable particle size. The particle size of a particle suspended in a liquid carrier may be defined in the industry using various means. For example, the particle size may be defined as the diameter of the smallest sphere that encompasses the particle and may be measured using a number of commercially available instruments, for example, including the CPS Disc Centrifuge, Model DC24000HR (available from CPS Instruments, Prairieville, La.) or the Zetasizer® available from Malvern Instruments®. The abrasive particles may have an average particle size of about 5 nm or more (e.g., about 10 nm or more, about 20 nm or more, about 30 nm or more, about 40 nm or more, about 50 nm or more, or about 60 nm or more). The abrasive particles may have an average particle size of about 300 nm or less (e.g., about 250 nm or less, about 200 nm or less, about 180 nm or less, or about 150 nm or less). Accordingly, the abrasive particles may have an average particle size in a range bounded by any two of the above endpoints. For example, the abrasive particles may have an average particle size in a range from about 5 nm to about 300 nm (e.g., from about 10 nm to about 200 nm, from about 20 nm to about 200 nm, or from about 50 nm to about 150 nm).

The polishing composition may include substantially any suitable amount of the abrasive particles. The polishing composition may include about 0.01 wt. % or more of the abrasive particles at point of use (e.g., about 0.02 wt. % or more, about 0.05 wt. % or more, about 0.1 wt. % or more, about 0.2 wt. % or more, or 0.5 wt. % or more). The polishing composition may also include about 20 wt. % or less of the abrasive particles at point of use (e.g., about 10 wt. % or less, about 5 wt. % or less, about 3 wt. % or less, or about 2 wt. % or less). Accordingly, the point of use concentration of abrasive particles in the polishing composition may be in a range bounded by any two of the above endpoints. For example, the amount of abrasive particles in the polishing composition may be in a range from about 0.01 wt. % to about 20 wt. % (e.g., from about 0.02 wt. % to about 10 wt. %, from about 0.05 wt. % to about 5 wt. %, from about 0.1 wt. % to about 3 wt. %, or from about 0.1 wt. % to about 2 wt. %).

The abrasive particles in the disclosed polishing compositions may include substantially any suitable surface charge. The charge on dispersed particles such as silica particles or alumina particles is commonly referred to in the art as the zeta potential (or the electrokinetic potential). The zeta potential of a particle refers to the electrical potential difference between the electrical charge of the ions surrounding the particle and the electrical charge of the bulk solution of the polishing composition (e.g., the liquid carrier and any other components dissolved therein). The zeta potential is typically dependent on the pH of the aqueous medium. For a given polishing composition, the isoelectric point of the particles is defined as the pH at which the zeta potential is zero. As the pH is increased or decreased away from the isoelectric point, the surface charge (and hence the zeta potential) is correspondingly decreased or increased (to negative or positive zeta potential values). The zeta potential of a dispersion such as a polishing composition may be obtained using commercially available instrumentation such as the Zetasizer® available from Malvern® Instruments, the ZetaPlus Zeta Potential Analyzer available from Brookhaven Instruments, and/or an electro-acoustic spectrometer available from Dispersion Technologies, Inc.

In certain preferred embodiments, the disclosed polishing compositions may advantageously include anionic abrasive particles, for example, including anionic silica particles, anionic alumina particles, or a mixture thereof. By "anionic" is meant that the abrasive particles have a negative surface charge at the pH of the polishing composition. For example, the abrasive particles may have a negative charge (a negative zeta potential) of about 5 mV or more (e.g., about 10 mV or more, about 15 mV or more, or about 20 mV or more). The colloidal silica particles in the polishing composition may have a negative charge of about 40 mV or less. For example, the abrasive particles may have a zeta potential in a range from about negative 5 to about negative 40 mV (e.g., from about negative 10 to about negative 40 mV).

Colloidal silica particles may be anionic in their natural state at the pH of the polishing composition. In preferred embodiments, the colloidal silica particles are rendered anionic at the pH of the polishing composition via surface metal doping and/or chemical surface treatment or partial surface treatment, for example, with an organic acid, a sulfur-based acid, a phosphorus-based acid, and/or an anionic polymer. Such treatment methodologies are known to those of ordinary skill in the art (e.g., as disclosed in U.S. Pat. No. 9,382,450).

Anionic alumina particles may likewise be prepared by treating at least a portion of the surface of the particle surface with a negatively-charged compound, for example, including an organic acid, a sulfur-based acid, a phosphorus-based acid, and/or an anionic polymer. In certain embodiments the alumina may include alpha alumina and the anionic polymer may include poly(2-acrylamido-2-methyl-propane sulfonic acid) or polystyrene sulfonic acid.

The polishing composition may advantageously include first and second compounds to reduce or inhibit the corrosion (etch) rate of tungsten or molybdenum in the polishing composition. In such embodiments, the first compound may be advantageously cationic (positively charged) while the second compound may be advantageously anionic (negatively charged). The use of such first and second compounds can surprisingly and advantageously provide for a synergistic reduction in the static etch rate of molybdenum. While not wishing to be bound by theory, it is believed that the positively charged first compound associates (e.g., via coulomb interaction) with the negatively charged molybdenum oxide surface while the negatively charged second compound associates with the positively charged first compound, thereby forming a more robust protective film on the surface of the molybdenum layer (and further inhibiting molybdenum and/or tungsten corrosion). In certain embodiments, the polishing compound may further include a third compound to provide further etch inhibition.

In the disclosed embodiments, the first compound may include an amino acid. Substantially any suitable amino acid may be utilized for example including alanine, arginine, asparagine, aspartic acid, cysteine, glutamine, glutamic acid, glycine, histidine, isoleucine, leucine, lysine, methionine, phenylalanine, proline, serine, threonine, tryptophan, tyrosine, and valine. Preferred amino acids include arginine, histidine, lysine, and cysteine. Arginine and histidine are most preferred amino acids.

The polishing composition may include substantially any suitable amount of amino acid. The amino acid may be present in the polishing composition in an amount (or concentration) ranging from about 0.0005 M to about 0.5 M. For example, the polishing composition may include about 0.001 M or more amino acid at point of use (e.g., about 0.002 M or more, about 0.003 M or more, about 0.004 M, or about 0.005 M or more). The polishing composition may include about 0.1 M or less at point of use (e.g., about 0.08 M or less, about 0.07 M or less, about 0.06M or less, or about 0.05 M or less). Accordingly, the amino acid may be at a concentration in the polishing composition in a range bounded by any one of the above endpoints, for example, from about 0.001 M to about 0.1M or from about 0.005 M to about 0.05M.

The second compound may include substantially any suitable anionic polymer. Suitable anionic polymers may be homopolymers or copolymers and may include monomer units selected, for example, from carboxylic acid groups, sulfonic acid groups, and phosphonic acid groups. For example suitable anionic polymers may include poly(acrylic acid) (PAA), poly(methacrylic acid) (PMAA), poly(maleic acid) (PMA), poly(vinyl sulfonic acid) (PVSA), poly(styrene sulfonic acid), poly(2-acrylamido-2-methylpropane sulfonic acid), poly(styrenesulfonic acid-co-maleic acid), and combinations thereof. Preferred anionic polymers include poly(vinyl sulfonic acid) (PVSA), poly(styrene sulfonic acid) (PSSA), and mixtures thereof.

The polishing composition may include substantially any suitable amount of anionic polymer. The anionic polymer may be present in the polishing composition in an amount (or concentration) ranging from about 1 ppm by weight to about 10,000 ppm by weight (1 weight percent). For example, the polishing composition may include about 10 ppm or more anionic polymer at point of use (e.g., about 20 ppm or more, about 40 ppm or more, or about 50 ppm or more). The polishing composition may include about 2500 ppm or less at point of use (e.g., about 2000 ppm or less, about 1000 ppm or less, or about 500 ppm or less). Accordingly, the polishing composition may include an amount of anionic polymer in a range bounded by any one of the above endpoints, for example, from about 10 ppm by weight to about 2500 ppm by weight or from about 50 ppm by weight to about 500 ppm by weight.

In other embodiments of the present invention, the second compound may include substantially any suitable anionic surfactant. Suitable anionic surfactants include anionic surfactants having a functional group that carries a negative charge in a desired pH working space (e.g. sulfonate and sulfate), and an alkyl group. Preferred anionic surfactants may have the negatively charged functional group accompanied by ether and/or phenol. The negatively charged functional group is preferably a sulfate group or a sulfonate group. Example suitable anionic surfactants include disodium hexadecyldiphenyloxide disulfonate, ammonium polyoxyethylene styrenated aryl sulfate, and ammonium alkyl polyoxethylene ether sulfate (such as ammonium polyoxyethylene oleyl cetyl ether sulfate, and ammonium lauryl polyoxyethylene ether sulfate).

The polishing composition may include substantially any suitable amount of anionic surfactant. The anionic surfactant may be present in the polishing composition in an amount (or concentration) ranging from about 1 ppm by weight to about 10,000 ppm by weight (1 weight percent). For example, the polishing composition may include about 10 ppm or more anionic surfactant at point of use (e.g., about 30 ppm or more, about 50 ppm or more, or about 100 ppm or more). The polishing composition may include about 2500 ppm or less anionic surfactant at point of use (e.g., about 2000 ppm or less, about 1500 ppm or less, or about 1000 ppm or less). Accordingly, the polishing composition may include an amount of anionic surfactant in a range bounded by any one of the above endpoints, for example, from about 50 ppm by weight to about 1500 ppm by weight or from about 100 ppm by weight to about 1000 ppm by weight.

In embodiments including an anionic surfactant, the disclosed compositions may optionally further include a third optional compound including an amino acid surfactant that may further reduce molybdenum or tungsten etch rates (in certain compositions). The third compound may include substantially any suitable amino acid surfactant. As used herein an amino acid surfactant is a surfactant including an amino acid group, for example, synthesized by the condensation of a natural amino acid with a fatty acid (or fatty acid derivative). Example amino acid surfactants include N-substituted amino acids and salts thereof, for example, N-acyl amino acids and salts thereof (with example salts including sodium, potassium, ammonia, and triethanolamine salts). The amino acid surfactant may include substantially any suitable amino acid group, for example, including glycine, alanine, arginine, histidine, lysine, aspartic acid, and glutamic acid. The example embodiments described in more detail below included Triethanolamine N-Cocoyl-DL-alaninate (AMILITE® ACS-12, available from Ajinomoto Health & Nutrition North America, Inc.), L-Arginine Cocoate (AMINOSOAP AR-12, available from Ajinomoto Health & Nutrition North America, Inc.), and Glycine, N-methyl-N-(1-oxododecyl) (Crodasinic LP30-LQ-(RB), available from Croda Personal Care).

The disclosed compositions may include substantially any suitable amount of amino acid surfactant. The amino acid surfactant may be present in the polishing composition in an amount (or concentration) ranging from about 0 ppm by weight to about 10,000 ppm by weight (1 weight percent). For example, the polishing composition may include about 5 ppm or more amino acid surfactant at point of use (e.g., about 10 ppm or more, about 20 ppm or more, or about 30 ppm or more). The polishing composition may include about 2000 ppm or less amino acid surfactant at point of use (e.g., about 1000 ppm or less, about 500 ppm or less, or about 300 ppm or less). Accordingly, the polishing composition may include an amount of amino acid surfactant in a range bounded by any one of the above endpoints, for example, from about 10 ppm by weight to about 1000 ppm by weight or from about 30 ppm by weight to about 300 ppm by weight.

The polishing composition may have substantially any pH suitable for polishing a tungsten or molybdenum layer. The composition is generally acidic having a pH of less than about 7. In certain embodiments the composition may have a pH of about 1 or more (e.g., about 1.5 or more, about 2 or more, about 2.5 or more, or about 3 or more). The composition may have a pH of about 6 or less (e.g., about 5 or less, about 4.5 or less, about 4 or less, or about 3.5 or less). Accordingly, the composition may have a pH in a range bounded by any of the above values. For example, a molybdenum polishing composition may have a pH in a range from about 1 to about 6 (e.g., from about 1 to about 5, from about 2 to about 4.5, or from about 2 to about 4).

It will be understood that the pH of the polishing composition may be achieved and/or maintained by any suitable means (depending of course on the desired pH). The polishing composition may include substantially any suitable pH adjusting agents or buffering systems. For example, suitable pH adjusting agents may include nitric acid, sulfuric acid, phosphoric acid, phthalic acid, citric acid, adipic acid, oxalic acid, malonic acid, maleic acid, ammonium hydroxide, potassium hydroxide, tetraethyl ammonium hydroxide, tetrabutyl ammonium hydroxide, and the like while suitable buffering agents may include phosphates, sulfates, acetates, malonates, oxalates, borates, ammonium salts, propionates, mixtures thereof, and the like.

The polishing composition may include other optional compounds, for example, including an oxidizing agent, an iron containing tungsten or molybdenum polishing accelerator, and a stabilizing agent. An iron containing accelerator as used herein is an iron containing chemical compound that increases the removal rate of tungsten and molybdenum during the CMP operation. For example, the iron containing accelerator may include a soluble iron containing catalyst such as is disclosed in U.S. Pat. Nos. 5,958,288 and 5,980,775. Such an iron containing catalyst may be soluble in the liquid carrier and may include, for example, ferric (iron III) or ferrous (iron II) compounds such as iron nitrate, iron sulfate, iron halides, including fluorides, chlorides, bromides, and iodides, as well as perchlorates, perbromates and periodates, and organic iron compounds such as iron acetates, carboxylic acids, acetylacetonates, citrates, gluconates, malonates, oxalates, phthalates, and succinates, and mixtures thereof.

The amount of iron containing accelerator in the polishing composition may be varied depending upon the oxidizing agent used and the chemical form of the accelerator. When the oxidizing agent is hydrogen peroxide (or one of its analogs) and a soluble iron containing accelerator or catalyst is used (such as ferric nitrate or hydrates of ferric nitrate), the accelerator may be present in the composition at point of use in an amount sufficient to provide a range from about 1 to about 5000 ppm Fe based on the total weight of the composition. The polishing composition may include about 10 ppm Fe or more at point of use (e.g., about 20 ppm or more, about 30 ppm or more, or about 50 ppm or more). The polishing composition may include about 5000 ppm Fe or less at point of use (e.g., about 3000 ppm or less, about 2000 ppm or less, or about 1000 ppm or less). The polishing composition may thus include Fe in a range bounded by any one of the above endpoints. The composition may include from about 10 to about 5000 ppm Fe at point of use (e.g., from about 20 to about 2000 ppm or from about 50 to about 1000 ppm).

Embodiments of the polishing composition including an iron containing accelerator may further include a stabilizer. Without such a stabilizer, the iron containing accelerator and the oxidizing agent, if present, may react in a manner that degrades the oxidizing agent rapidly over time. The addition of a stabilizer tends to reduce the effectiveness of the iron containing accelerator such that the choice of the type and amount of stabilizer added to the polishing composition may have a significant impact on CMP performance. The addition of a stabilizer may lead to the formation of a stabilizer/accelerator complex that inhibits the accelerator from reacting with the oxidizing agent, if present, while at the same time allowing the accelerator to remain sufficiently active so as to promote rapid molybdenum polishing rates.

Useful stabilizers include phosphoric acid, organic acids, phosphonate compounds, nitriles, and other ligands which bind to the metal and reduce its reactivity toward hydrogen peroxide decomposition and mixture thereof. The acid stabilizers may be used in their conjugate form, e.g., the carboxylate can be used instead of the carboxylic acid. The term "acid" as it is used herein to describe useful stabilizers also means the conjugate base of the acid stabilizer. Stabilizers can be used alone or in combination and significantly reduce the rate at which oxidizing agents such as hydrogen peroxide decompose.

Preferred stabilizers include phosphoric acid, acetic acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid (EDTA), propylenediaminetetraacetic acid (PDTA), and mixtures thereof. The preferred stabilizers may be added to the compositions of this invention in an amount ranging from about 1 equivalent per iron containing accelerator to about 3.0 weight percent or more (e.g., from about 3 to about 10 equivalents). As used herein, the term "equivalent per iron containing accelerator" means one molecule of stabilizer per iron ion in the composition. For example 2 equivalents per iron containing accelerator means two molecules of stabilizer for each catalyst ion.

The polishing composition may optionally further include an oxidizing agent. The oxidizing agent may be added to the polishing composition during the slurry manufacturing process or just prior to the CMP operation (e.g., in a tank located at the semiconductor fabrication facility). Preferable oxidizing agents include inorganic or organic per-compounds. A per-compound as defined herein is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-t-butyl peroxide, monopersulfates ($SO_5^=$), dipersulfates (5200, and sodium peroxide. Examples of compounds containing an element in its highest oxidation state include but are not limited to periodic acid, periodate salts, perbromic acid, perbromate salts, perchloric acid, perchlorate salts, perboric acid, and perborate salts and permanganates. The most preferred oxidizing agent is hydrogen peroxide.

The oxidizing agent may be present in the polishing composition in an amount ranging, for example, from about 0.01 to about 5 weight percent at point of use. In embodiments in which a hydrogen peroxide oxidizer and a soluble iron containing accelerator are used, the oxidizer may be advantageously present in the polishing composition in an amount ranging from about 0.05 to about 2 weight percent at point of use (e.g., from about 0.05 to about 1 weight percent or from about 0.1 to about 1 weight percent).

The polishing composition may optionally further include a biocide. The biocide may include any suitable biocide, for example an isothiazolinone biocide. The amount of biocide in the polishing composition typically is in a range from about 1 ppm to about 50 ppm at point of use or in a concentrate, and preferably from about 1 ppm to about 20 ppm.

The polishing composition may be prepared using any suitable techniques, many of which are known to those skilled in the art. The polishing composition may be prepared in a batch or continuous process. Generally, the polishing composition may be prepared by combining the components thereof in any order. The term "component" as used herein includes the individual ingredients (e.g., the abrasive particles, the amino acid, the anionic polymer, the iron-containing accelerator, etc.).

For example, various polishing composition components (such as an amino acid, an anionic polymer, an iron-containing accelerator, a stabilizer, and/or a biocide) may be added directly to a dispersion including an anionic silica and/or anionic alumina abrasive. The components may be blended together using any suitable techniques for achieving adequate mixing. Such blending/mixing techniques are well known to those of ordinary skill in the art. An optional oxidizing such as hydrogen peroxide agent may be added at any time during the preparation of the polishing composition. For example, the polishing composition may be prepared prior to use, with one or more components, such as the oxidizing agent, being added just prior to the CMP operation (e.g., within about 1 minute, or within about 10 minutes, or within about 1 hour, or within about 1 day, or within about 1 week of the CMP operation). The polishing composition also may also be prepared by mixing the components at the surface of the substrate (e.g., on the polishing pad) during the CMP operation.

The polishing composition may advantageously be supplied as a one-package system including the comprising a colloidal silica having the above described physical properties and other optional components. An oxidizing agent (e.g., hydrogen peroxide) may be desirably supplied separately from the other components of the polishing composition and may be combined, e.g., by the end-user, with the other components of the polishing composition shortly before use (e.g., 1 week or less prior to use, 1 day or less prior to use, 1 hour or less prior to use, 10 minutes or less prior to use, or 1 minute or less prior to use). Various other two-container, or three- or more-container, combinations of the components of the polishing composition are within the knowledge of one of ordinary skill in the art.

The polishing composition of the invention may also be provided as a concentrate which is intended to be diluted with an appropriate amount of water prior to use. In such an embodiment, the polishing composition concentrate may include the abrasive particles, the amino acid, the anionic polymer water, and other optional components such as an iron-containing accelerator, a stabilizer, and a biocide, with or without the oxidizing agent, in amounts such that, upon dilution of the concentrate with an appropriate amount of water, and an optional oxidizing agent if not already present in an appropriate amount, each component of the polishing composition will be present in the polishing composition in an amount within the appropriate ranges recited above for each component. For example, each of the components may each be present in the polishing composition in an amount that is about 2 times (e.g., about 3 times, about 4 times, about 5 times, or even about 10 times) greater than the point of use concentrations recited above for each component so that, when the concentrate is diluted with an equal volume of water (e.g., 2 equal volumes of water, 3 equal volumes of water, 4 equal volumes of water, or even 9 equal volumes of water respectively), along with the oxidizing agent in a suitable amount, each component will be present in the polishing composition in an amount within the ranges set forth above for each component. Furthermore, as will be understood by those of ordinary skill in the art, the concentrate may contain an appropriate fraction of the water present in the final polishing composition in order to ensure that other components are at least partially or fully dissolved in the concentrate.

The polishing method of the invention is particularly suited for use in conjunction with a chemical mechanical polishing (CMP) apparatus. Typically, the apparatus includes a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the molybdenum layer on the substrate, so as to abrade at least a portion of the molybdenum layer and thereby polish the substrate.

In certain desirably embodiments, the disclosed polishing composition enables high molybdenum or tungsten polishing rates with a composition having low molybdenum or tungsten etch rates. For example, the disclosed embodiments may include a method for chemical mechanical polishing a molybdenum layer in which the tungsten or molybdenum removal rate is greater than 1000 Å/min (e.g., greater than 1200 Å/min or greater than 1500 Å/min) and wherein the composition has a tungsten or molybdenum etch rate of less than 150 Å/min (e.g., less than 100 Å/min, less than 75 Å/min, less than 50 Å/min, or even less than 25 Å/min). Desirable embodiments may further enable high tungsten or molybdenum polishing rates with low dynamic etch rates (e.g., dynamic etch rates of less than 200 Å/min, less than 100 Å/min, less than 75 Å/min, or less than 50 Å/min).

It will be understood that a dynamic etch rate may be an equal or better indicator than a static etch rate in evaluating the performance of the composition in a CMP operation. While the disclosed embodiments are of course not limited in this regard, the dynamic conditions present when evaluating a dynamic etch rate may be closer to those experienced in a CMP operation (in which the polishing composition may be moving or flowing over the surface of the wafer).

A substrate can be planarized or polished with the chemical mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, co-formed products thereof, and mixtures thereof.

It will be understood that the disclosure includes numerous embodiments. These embodiments include, but are not limited to, the following embodiments.

In a first embodiment a composition may comprise, consist of, or consist essentially of a chemical mechanical polishing composition comprising: a water based liquid carrier; abrasive particles dispersed in the liquid carrier; an amino acid selected from the group consisting of arginine, histidine, cysteine, lysine, and mixtures thereof; and an anionic polymer or an anionic surfactant.

A second embodiment may include the first embodiment wherein the composition further comprises an iron-containing accelerator and a stabilizer bound to the iron-containing accelerator.

A third embodiment may include any one of the first and second embodiments wherein the composition further comprises a hydrogen peroxide oxidizer.

A fourth embodiment may include any one of the first through third embodiments, wherein the anionic polymer is selected from the group consisting of polysulfonic acids, polyacrylic acids, and polyphosphoric acids.

A fifth embodiment may include any one of the first through fourth embodiments, wherein the anionic polymer is a polysulfonic acid polymer comprising sulfonic acid monomer units selected from the group consisting of polyvinyl sulfonic acid, polystyrenesulfonic acid, poly(2-acrylamido-2-methyl-1-propanesulfonic acid), poly(styrenesulfonic acid-co-maleic acid), and mixtures thereof.

A sixth embodiment may include any one of the first through fifth embodiments, wherein the anionic polymer is polyvinylsulfonic acid (PVSA) or polystyrenesulfonic acid (PSSA).

A seventh embodiment may include any one of the first through sixth embodiments, wherein the amino acid is selected from the group consisting of arginine, histidine, and mixtures thereof.

An eighth embodiment may include any one of the first through seventh embodiments, wherein the anionic surfactant comprises an alkyl group and a negative charged sulfate or sulfonate group.

A ninth embodiment may include any one of the first through eighth embodiments, wherein the anionic surfactant is selected from the group consisting of disodium hexadecyl-diphenyloxide disulfonate, ammonium lauryl polyoxyethylene ether sulfate, ammonium polyoxyethylene styrenated aryl sulfate, and combinations thereof.

A tenth embodiment may include any one of the first through eighth embodiments, wherein the abrasive particles comprise anionic silica or anionic alumina.

An eleventh embodiment may include any one of the first through tenth embodiments, further comprising an amino acid surfactant.

A twelfth embodiment may include the eleventh embodiment, wherein the amino acid surfactant comprises an amino acid group selected from the group consisting of glycine, alanine, arginine, histidine, lysine, aspartic acid, and glutamic acid.

A thirteenth embodiment may include the eleventh embodiment, wherein the amino acid surfactant comprises Triethanolamine N-Cocoyl-DL-alaninate, L-Arginine Cocoate, Glycine, N-methyl-N-(1-oxododecyl), and mixtures thereof.

A fourteenth embodiment may include the eleventh embodiment, comprising from about 100 ppm by weight to about 1000 ppm by weight of the anionic surfactant and about 30 ppm by weight to about 300 ppm by weight of the amino acid surfactant.

A fifteenth embodiment may including any one of the first through the fourteenth embodiments, wherein the abrasive particles comprise anionic silica or anionic alumina; the amino acid is selected from the group consisting of arginine, histidine, and mixtures thereof; and the anionic polymer or the anionic surfactant comprises an anionic surfactant including an alkyl group and a negative charged sulfate or sulfonate group.

A sixteenth embodiment may include the fifteenth embodiment, further comprising an amino acid surfactant including an amino acid group selected from the group consisting of glycine, alanine, arginine, histidine, lysine, aspartic acid, and glutamic acid.

In a seventeenth embodiment a method of chemical mechanical polishing a substrate having a tungsten layer or a molybdenum layer may comprise, consist of, or consist essentially of (a) contacting the substrate with any one of the first through sixteenth polishing composition embodiments; (b) moving the polishing composition relative to the substrate; and (c) abrading the substrate to remove a portion of the tungsten layer or the molybdenum layer from the substrate and thereby polish the substrate.

Example 1

This example demonstrates the effectiveness of inventive compositions in reducing the static etch rate of molybdenum. Twenty-seven compositions were prepared (Controls 1-1, 1-2, and 1-3 and Examples 1A, 1B, 1C, 1D, 1E, 1F, 1G, 1H, 1I, 1J, 1K, 1L, 1M, 1N, 1O, 1P, 1Q, 1R, 1S, 1T, 1U, 1V, 1W, and 1X). Each composition included 0.01 molar (M) amino acid, 300 ppm by weight anionic polymer, 0.23 weight percent ferric nitrate nonahydrate ($Fe(NO_3)_3 \cdot 9H_2O$), 0.29 weight percent malonic acid, and 0.25 weight percent hydrogen peroxide at pH 2. The particular amino acid and anionic polymer compounds used in each composition are listed in Table 1.

The static etch rate of molybdenum in each of the above-described twenty-seven compositions was evaluated. Two-inch wafers having a molybdenum layer were submersed in the respective compositions (molybdenum side up) for 3 minutes at 25 degrees C. Molybdenum removal rates were determined via resistivity measurements made before and after immersion in the compositions.

The amino acid, anionic polymer, and molybdenum etch rates are also shown in Table 1 in which PSSA refers to poly(styrene sulfonic acid) and PVSA refers to poly(vinyl sulfonic acid).

TABLE 1

| Composition | Amino Acid | Anionic Polymer | Etch Rate (Å/min) |
|---|---|---|---|
| Control 1-1 | NA | NA | 407 |
| 1A | Arginine | NA | 75 |
| 1B | Histidine | NA | 100 |
| 1C | Lysine | NA | 126 |
| 1D | Cysteine | NA | 88 |
| 1E | Asparagine | NA | 322 |
| 1F | Glutamic Acid | NA | 385 |
| 1G | Glycine | NA | 345 |
| 1H | Proline | NA | 335 |
| Control 1-2 | NA | PSSA | 397 |
| 1I | Arginine | PSSA | 23 |
| 1J | Histidine | PSSA | 52 |
| 1K | Lysine | PSSA | 86 |
| 1L | Cysteine | PSSA | 75 |
| 1M | Asparagine | PSSA | 303 |
| 1N | Glutamic Acid | PSSA | 284 |
| 1O | Glycine | PSSA | 295 |
| 1P | Proline | PSSA | 294 |
| Control 1-3 | NA | PVSA | 429 |
| 1Q | Arginine | PVSA | 16 |
| 1R | Histidine | PVSA | 24 |
| 1S | Lysine | PVSA | 77 |
| 1T | Cysteine | PVSA | 79 |
| 1U | Asparagine | PVSA | 318 |

TABLE 1-continued

| Composition | Amino Acid | Anionic Polymer | Etch Rate (Å/min) |
|---|---|---|---|
| 1V | Glutamic Acid | PVSA | 300 |
| 1W | Glycine | PVSA | 331 |
| 1X | Proline | PVSA | 325 |

As is apparent from the results set forth in Table 1, the etch rate of molybdenum was lower in compositions 1I-1L and 1Q-1T than in the other compositions. It is evident that the etch rate of molybdenum is lower in compositions including an anionic polymer and at least one of arginine, histidine, lysine and cysteine than in compositions including other amino acids (1M-1P and 1U-1X) or no anionic polymer (1A-1H). Moreover, the molybdenum etch rate in compositions 1I, 1J, 1Q, and 1R (including arginine or histidine) were the lowest when combined with PSSA or PVSA. The etch rate was lowest in composition 1Q (arginine and PVSA).

Example 2

This example demonstrates the effectiveness of the inventive compositions to polish molybdenum. Molybdenum polishing rates were evaluated in this example for two polishing compositions. Each composition included arginine amino acid, PSSA anionic polymer, 0.5 weight percent anionic colloidal silica (PL-3D available from Fuso Chemical Company), 0.3 weight percent ferric nitrate nonahydrate (Fe(NO$_3$)$_3$.9H$_2$O), 0.37 weight percent malonic acid, and 0.1 weight percent hydrogen peroxide at pH 2.0. Polishing composition 2A included 550 ppm by weight arginine and 70 ppm by weight PSSA. Polishing composition 2B included 1000 ppm by weight arginine and 200 ppm by weight PSSA. The zeta-potential of the anionic silica was −20 mV at pH 2 as measured using the Malvern Zetasizer®.

The molybdenum polishing rates were obtained by polishing a blanket molybdenum wafer. The wafers were polished using a Mirra® CMP polishing tool and a NexPlanar E6088 polishing pad at a downforce of 2.0 psi, a platen speed of 93 rpm, and a head speed of 87 rpm. The slurry flow rate was 150 ml/min. The molybdenum etch rates in compositions 2A and 2B were also evaluated using the procedure described above in Example 1. The molybdenum polishing and etch rates are set forth in Table 2.

TABLE 2

| Polishing Composition | Mo Polishing Rate (Å/min) | Etch Rate (Å/min) |
|---|---|---|
| 2A | 1178 | 35 |
| 2B | 767 | 19 |

As is apparent from the results set forth in Table 2, a polishing composition including amino acid and anionic polymer compounds (arginine and PSSA in this example) can achieve a high molybdenum removal rate. Polishing composition 2A (having 550 ppm arginine and 70 ppm PSSA) achieved a higher removal rate than composition 2B (having 1000 ppm arginine and 200 pm PSSA). The etch rate of molybdenum was low in both compositions.

Example 3

This example demonstrates the effectiveness of the inventive compositions to polish molybdenum. Molybdenum polishing rates were evaluated in this example for two polishing compositions. Each composition included 550 ppm by weight arginine amino acid, 70 ppm by weight PSSA anionic polymer, 0.5 weight percent anionic abrasive particles, 0.4 weight percent ferric nitrate nonahydrate (Fe(NO$_3$)$_3$.9H$_2$O), 0.5 weight percent malonic acid, and 0.1 weight percent hydrogen peroxide at pH 2.0. Polishing composition 3A included 0.5 weight percent anionic alumina (an α-alumina treated with poly(2-acrylamido-2-methylpropane sulfonic acid)). Polishing composition 3B included 0.5 weight percent anionic colloidal silica (PL-3D available from Fuso Chemical Company).

The molybdenum polishing rates were obtained by polishing blanket molybdenum wafers. The wafers were polished using a Mirra® CMP polishing tool and a NexPlanar E6088 polishing pad at a downforce of 2.0 psi, a platen speed of 93 rpm, and a head speed of 87 rpm. The slurry flow rate was 150 ml/min. The molybdenum polishing rates are shown in Table 3.

TABLE 3

| Polishing Composition | Mo Polishing Rate, Å/min |
|---|---|
| 3A | 1540 |
| 3B | 1670 |

As is apparent from the results set forth in Table 3, suitable molybdenum removal rates can be achieved using an anionic alumina or anionic silica abrasive. Moreover, it is evident that a high molybdenum removal rates can be achieved using a low concentration of abrasive particles (0.5 weight percent).

Example 4

This example demonstrates the effectiveness of the inventive compositions to reduce the static etch rate of molybdenum. Thirty compositions were prepared (Controls 4-1, 4-2, 4-3, 4-4, 4-5 and 4-6, and Examples 4A, 4B, 4C, 4D, 4E, 4F, 4G, 4H, 4I, 4J, 4K, 4L, 4M, 4N, 4O, 4P, 4Q, 4R, 4S, 4T, 4U, 4V, 4W, and 4X). Each composition included 0.01 molar (M) amino acid, 500 ppm by weight anionic surfactant, 0.31 weight percent of ferric nitrate nonahydrate (Fe(NO$_3$)$_3$.9H$_2$O), 0.43 weight percent malonic acid, 200 ppm by weight of Igepal CA630 (a stabilizer for Fe ion), and 0.1 weight percent hydrogen peroxide at pH 2. The particular amino acid and anionic surfactant compounds used in each composition are listed in Table 4.

In Table 4 SDS represents sodium dodecyl sulfate, TSF-20 represents disodium hexadecyldiphenyloxide disulfonate, Sinonate1105SF represents ammonium lauryl polyoxyethylene ether sulfate, and Sinonate S619SF represents ammonium polyoxyethylene styrenated aryl sulfate.

The static etch rate of molybdenum in each of the above-described thirty compositions was evaluated. To obtain the molybdenum etch rate in each composition, two-inch wafers having a molybdenum layer were submersed in the respective compositions (molybdenum side up) for 2 minutes at 45 degrees C. Molybdenum removal rates were determined via resistivity measurements made before and after immersion in the compositions.

TABLE 4

| Composition | Amino Acid | Anionic Surfactant | Etch Rate (Å/min) |
|---|---|---|---|
| Control 4-1 | Arginine | NA | 105 |
| 4A | Arginine | Sinonate1105SF | 35 |
| 4B | Arginine | SinonateS619SF | 37 |
| 4C | Arginine | TSF-20 | 45 |
| 4D | Arginine | SDS | 141 |
| Control 4-2 | Histidine | NA | 141 |
| 4E | Histidine | Sinonate1105SF | 13 |
| 4F | Histidine | SinonateS619SF | 61 |
| 4G | Histidine | TSF-20 | 99 |
| 4H | Histidine | SDS | 98 |
| Control 4-3 | Cysteine | NA | 115 |
| 4I | Cysteine | Sinonate1105SF | 128 |
| 4J | Cysteine | SinonateS619SF | 101 |
| 4K | Cysteine | TSF-20 | 41 |
| 4L | Cysteine | SDS | 93 |
| Control 4-4 | Lysine | NA | 133 |
| 4M | Lysine | Sinonate1105SF | 27 |
| 4N | Lysine | SinonateS619SF | 174 |
| 4O | Lysine | TSF-20 | 125 |
| 4P | Lysine | SDS | 234 |
| Control 4-5 | Glycine | NA | 422 |
| 4Q | Glycine | Sinonate1105SF | 454 |
| 4R | Glycine | SinonateS619SF | 414 |
| 4S | Glycine | TSF-20 | 548 |
| 4T | Glycine | SDS | 435 |
| Control 4-6 | NA | NA | 583 |
| 4U | NA | Sinonate1105SF | 434 |
| 4V | NA | SinonateS619SF | 411 |
| 4W | NA | TSF-20 | 580 |
| 4X | NA | SDS | 601 |

As is apparent from the results set forth in Table 4, compositions containing certain combinations of amino acids and anionic surfactants exhibited significantly lower molybdenum etch rates than the other compositions. It is evident that compositions including an anionic surfactant and at least one of arginine, histidine, lysine and cysteine have significantly lower molybdenum etch rates than compositions including other amino acids, such as glycine (4Q-4T), no amino acid (4U-4X) or no anionic surfactant (Controls 4-1 through 4-6). Moreover, compositions 4A-4H including arginine or histidine exhibit significantly reduced molybdenum etch rates (and have the lowest etch rates) when combined with disodium hexadecyldiphenyloxide disulfonate, ammonium lauryl polyoxyethylene ether sulfate or ammonium polyoxyethylene styrenated aryl sulfate.

Example 5

This example demonstrates that low molybdenum static etch rates and high molybdenum removal rates are possible with disclosed compositions. Two slurries were prepared. Slurry 5A consisted of 0.35 weight percent malonic acid, 0.18 weight percent ferric nitrate nonahydrate, 500 ppm Igepal CA630, 600 ppm arginine, 700 ppm TSF-20, 75 ppm Proxel Ultra10 (biocide), and 0.13 weight percent anionic alumina. Slurry 5B consisted of 0.43 weight percent malonic acid, 0.31 weight percent ferric nitrate nonahydrate, 100 ppm Igepal CA630, 800 ppm arginine, 400 ppm Sinoate1105SF, 75 ppm Proxel Ultra10 (biocide), and 0.13 weight percent anionic silica.

Molybdenum static etch rates (SER) were measured as described in Example 4. Molybdenum polishing rates were measured on a Mirra® CMP polishing tool using a NexPlanar E6088 polishing pad at a downforce of 2.0 psi, a platen speed of 93 rpm, and a head speed of 87 rpm. The slurry flow rate was 150 ml/min. The results are shown in Table 5.

TABLE 5

| Composition | SER (Å/min) | Mo Removal Rate (Å/min) |
|---|---|---|
| 5A | 73 | 864 |
| 5B | 33 | 997 |

The results demonstrate that the inventive compositions including arginine and an anionic surfactant achieve both low molybdenum static etch rates and high molybdenum polishing rates.

Example 6

This example evaluates the solubility (via turbidity measurements) of certain amino acid surfactant containing compositions. Twenty compositions were prepared (Controls 6-1, 6-2, 6-3, and 6-4 and Examples 6A, 6B, 6C, 6D, 6E, 6F, 6G, 6H, 6I, 6J, 6K, 6L, 6M, 6N, 6O, and 6P). Each composition included an amino acid, an anionic surfactant, 0.3 weight percent of ferric nitrate nonahydrate (Fe(NO$_3$)$_3$.9H$_2$O), and 0.33 weight percent malonic acid at pH 2.3. Selected compositions further included 100 ppm of an amino acid surfactant. The particular amino acid, anionic surfactant, and amino acid surfactant compounds used in each composition are listed in Table 6. The anionic surfactants are defined above in Example 4. Sinonate 1204SF represents another ammonium lauryl polyoxyethylene ether sulfate surfactant.

In Table 6, ACS-12 represents AMILITE® ACS-12 (available from Ajinomoto Health & Nutrition North America, Inc.) which is a surfactant derived from L-Alanine and natural fatty acids, AR-12 represents AMINOSOAP® AR-12 (available from Ajinomoto Health & Nutrition North America, Inc.) which is a surfactant derived from L-Arginine and coconut fatty acids, and LP-30 represents Crodasinic® LP30 (available from Croda) which is potassium salt of a glycine containing surfactant.

The turbidity of each composition was measured at room temperature using a Thermo Scientific Eutech TN-100 turbidimeter. The measured turbidity values are also listed in Table 6.

TABLE 6

| Composition | Amino Acid | Anionic Surfactant | Amino Acid Surfactant | Turbidity (NTU) |
|---|---|---|---|---|
| Control 6-1 | 800 ppm Arginine | | | 0.47 |
| Control 6-2 | 800 ppm Arginine | | ACS-12 | 83.6 |
| Control 6-3 | 800 ppm Arginine | | AR-12 | 49.6 |
| Control 6-4 | 800 ppm Arginine | | LP-30 | 54.8 |
| 6A | 800 ppm Arginine | 500 ppm Sinonate 1105SF | | 0 |
| 6B | 800 ppm Arginine | 500 ppm Sinonate 1105SF | ACS-12 | 0.3 |

TABLE 6-continued

| Composition | Amino Acid | Anionic Surfactant | Amino Acid Surfactant | Turbidity (NTU) |
|---|---|---|---|---|
| 6C | 800 ppm Arginine | 500 ppm Sinonate 1105SF | AR-12 | 0 |
| 6D | 800 ppm Arginine | 500 ppm Sinonate 1105SF | LP-30 | 0.6 |
| 6E | 1300 ppm Arginine | 500 ppm Sinonate S619SF | | 0 |
| 6F | 1300 ppm Arginine | 500 ppm Sinonate S619SF | ACS-12 | 36.6 |
| 6G | 1300 ppm Arginine | 500 ppm Sinonate S619SF | AR-12 | 0.15 |
| 6H | 1300 ppm Arginine | 500 ppm Sinonate S619SF | LP-30 | 3.84 |
| 6I | 800 ppm Arginine + 500 ppm Histidine | 500 ppm Sinonate 1204SF | | 3.15 |
| 6J | 800 ppm Arginine + 500 ppm Histidine | 500 ppm Sinonate 1204SF | ACS-12 | 9.06 |
| 6K | 800 ppm Arginine + 500 ppm Histidine | 500 ppm Sinonate 1204SF | AR-12 | 14.26 |
| 6L | 800 ppm Arginine + 500 ppm Histidine | 500 ppm Sinonate 1204SF | LP-30 | 6.26 |
| 6M | 800 ppm Arginine + 500 ppm Histidine | 500 ppm IgepalCA630 700 ppm TSF20 | | 4.32 |
| 6N | 800 ppm Arginine + 500 ppm Histidine | 500 ppm IgepalCA630 700 ppm TSF20 | ACS-12 | 147 |
| 6O | 800 ppm Arginine + 500 ppm Histidine | 500 ppm IgepalCA630 700 ppm TSF20 | AR-12 | 0.54 |
| 6P | 800 ppm Arginine + 500 ppm Histidine | 500 ppm IgepalCA630 700 ppm TSF20 | LP-30 | 10.55 |

As set forth Table 6, the compositions including the selected amino acid surfactants without the anionic surfactant (controls 6-2, 6-3, and 6-4) have relative high turbidity (possibly due to the low solubility of the amino acid surfactants). The addition of selected anionic surfactants was observed to significantly reduce the turbidity (e.g., in compositions 6B, 6C, 6D, 6G, 6I, and 6O). In this example, the Sinonate 1105SF anionic surfactant was most effective at reducing the turbidity (compositions 6B, 6C, and 6D).

Example 7

The static and dynamic etch rates of molybdenum were evaluated in this example for inventive compositions including an amino acid, an anionic surfactant, and an amino acid. Sixteen compositions were evaluated (examples 7A, 7B, 7C, 7D, 7E, 7F, 7G, 7H, 7I, 7J, 7K, 7L, 7M, 7N, 7O, and 7P). Each composition included 1300 ppm by weight arginine, an anionic surfactant, 0.3 weight percent of ferric nitrate nonahydrate ($Fe(NO_3)_3 \cdot 9H_2O$), 0.33 weight percent malonic acid, and 0.1 weight percent hydrogen peroxide at pH 2.3. Selected compositions further included 100 ppm by weight of an optional amino acid surfactant. The particular anionic surfactant and amino acid surfactant compounds used in each composition are listed in Table 7. The amino acid surfactants are defined above in Example 6.

Static (SER) and Dynamic (DER) etch rates of molybdenum were evaluated in each of the above-described compositions. The static etch rates were determined by submersing two-inch wafers having a molybdenum layer in the respective compositions (molybdenum side up) for 30 seconds at 45 degrees C. (using a procedure similar to that described above in Example 4. The static etch rates were determined in an unstirred composition. The dynamic etch rates were determined by immersing the wafers in a stirred composition for 2 min at 45 degrees C. Magnetic stirring (stirring with a magnetic stir bar) was used to generate the dynamic (shear) conditions. The magnetic stir bar was rotated at a rate of about 1200 rpm for the entire 2 min. SER and DER were determined via resistivity measurements made before and after immersion and are reported in Table 7.

| Composition | Anionic Surfactant | Amino Acid Surfactant | SER (Å/min) | DER (Å/min) |
|---|---|---|---|---|
| 7A | 500 ppm Sinonate 1105SF | | 34 | 94 |
| 7B | 500 ppm Sinonate 1105SF | AR-12 | 26 | 9 |
| 7C | 500 ppm Sinonate 1105SF | ACS-12 | 29 | 50 |
| 7D | 500 ppm Sinonate 1105SF | LP-30 | 26 | 29 |
| 7E | 500 ppm Sinonate 1204SF | | 91 | >300 |
| 7F | 500 ppm Sinonate 1204SF | AR-12 | 95 | 192 |
| 7G | 500 ppm Sinonate 1204SF | ACS-12 | 30 | 22 |
| 7H | 500 ppm Sinonate 1204SF | LP-30 | 52 | 145 |
| 7I | 500 ppm Sinonate S619SF | | 96 | 189 |
| 7J | 500 ppm Sinonate S619SF | AR-12 | 32 | 19 |
| 7K | 500 ppm Sinonate S619SF | ACS-12 | 26 | 22 |
| 7L | 500 ppm Sinonate S619SF | LP-30 | 21 | 17 |
| 7M | 400 ppm IgepalCA630 500 ppm TSF20 | | 68 | 58 |

-continued

| Composition | Anionic Surfactant | Amino Acid Surfactant | SER (Å/min) | DER (Å/min) |
|---|---|---|---|---|
| 7N | 400 ppm IgepalCA630 500 ppm TSF20 | AR-12 | 61 | 50 |
| 7O | 400 ppm IgepalCA630 500 ppm TSF20 | ACS-12 | 68 | 60 |
| 7P | 400 ppm IgepalCA630 500 ppm TSF20 | LP-30 | 75 | 71 |

As set forth in Table 7, the addition of selected amino acid surfactants to compositions including an amino acid and an anionic surfactant was observed to further reduce the static etch rate and to significantly reduce the dynamic etch rate of molybdenum (e.g., in compositions 7B, 7C, 7D, 7G, 7J, 7K, and 7L). Compositions including AMINOSOAP® AR-12 were observed to have the lowest static and dynamic etch rates in combination with a range of selected anionic surfactants (compositions 7B, 7F, 7J, and 7N).

Example 8

This example further demonstrates the effectiveness of inventive compositions including combinations of an amino acid, an anionic surfactant, and an optional amino acid surfactant at reducing the static and dynamic etch rates of molybdenum. Sixteen compositions were evaluated (examples 8A, 8B, 8C, 8D, 8E, 8F, 8G, 8H, 8I, 8J, 8K, 8L, 8M, 8N, 8O, and 8P). Each composition included 800 ppm by weight arginine, 500 ppm by weight histidine, 0.3 weight percent of ferric nitrate nonahydrate ($Fe(NO_3)_3 \cdot 9H_2O$), 0.33 weight percent malonic acid, Sinonate 1105SF anionic surfactant, and 0.1 weight percent hydrogen peroxide at pH 2.3. Selected compositions further included 100 ppm by weight, 200 ppm by weight, or 300 ppm by weight of AMINOSOAP® AR-12 amino acid surfactant. The particular Sinonate 1105SF and AE-12 concentrations are listed in Table 8.

The turbidity of each composition was measured at room temperature as described above in Example 6. Static and Dynamic molybdenum etch rates were evaluated for each of the above-described compositions as also described above in Example 7. The turbidity of each composition and the static and dynamic etch rates of molybdenum are reported in Table 8.

As set forth Table 8, the turbidity, static etch rate, and dynamic etch rate depend on the relative concentrations of anionic surfactant and amino acid surfactant. The lowest molybdenum etch rates were observed for compositions having at least 500 ppm anionic surfactant and at least 100 ppm amino acid surfactant. The turbidity was also observed to increase with increasing amino acid surfactant, particularly at about 300 ppm.

Example 9

This example evaluates the static and dynamic etch rates of molybdenum in compositions including an amino acid, an anionic surfactant, and an optional amino acid surfactant having different hydrogen peroxide concentrations. Eight compositions were evaluated (examples 9A, 9B, 9C, 9D, 9E, 9F, 9G, and 9H). Each composition included 1300 ppm by weight arginine, 500 ppm by weight of Sinonate 1105SF anionic surfactant, 0.3 weight percent of ferric nitrate nonahydrate ($Fe(NO_3)_3 \cdot 9H_2O$), and 0.33 weight percent malonic acid at pH 2.3. Selected compositions (9E, 9F, 9G, and 9H) further included 100 ppm by weight of AMINOSOAP® AR-12 amino acid surfactant. The hydrogen peroxide concentrations are listed in Table 9. The static etch rates of molybdenum were determined as described above in Example 7

TABLE 9

| Composition | Amino Acid Surfactant | Hydrogen Peroxide | SER (Å/min) |
|---|---|---|---|
| 9A | | 0.05 wt. % | 36 |
| 9B | | 0.1 wt. % | 43 |
| 9C | | 0.2 wt. % | 42 |
| 9D | | 0.4 wt. % | 59 |
| 9E | AMINOSOAP ® AR-12 | 0.05 wt. % | 29 |
| 9F | AMINOSOAP ® AR-12 | 0.1 wt. % | 30 |
| 9G | AMINOSOAP ® AR-12 | 0.2 wt. % | 28 |
| 9H | AMINOSOAP ® AR-12 | 0.4 wt. % | 37 |

TABLE 8

| Composition | Sinonate 1105SF (ppm) | AMINOSOAP ® AR-12 (ppm) | Turbidity (NTU) | SER (Å/min) | DER (Å/min) |
|---|---|---|---|---|---|
| 8A | 100 | 0 | 0.02 | 236 | 305 |
| 8B | 100 | 100 | 3.7 | 232 | 372 |
| 8C | 100 | 200 | 25.9 | 215 | 426 |
| 8D | 100 | 300 | 33.4 | 220 | 426 |
| 8E | 300 | 0 | 0 | 40 | 21 |
| 8F | 300 | 100 | 2.2 | 19 | 16 |
| 8G | 300 | 200 | 8.4 | 192 | 424 |
| 8H | 300 | 300 | 13.3 | 230 | 518 |
| 8I | 500 | 0 | 0 | 35 | 67 |
| 8J | 500 | 100 | 0 | 24 | 22 |
| 8K | 500 | 200 | 5.4 | 15 | 14 |
| 8L | 500 | 300 | 13.4 | 20 | 13 |
| 8M | 700 | 0 | 0 | 32 | 282 |
| 8N | 700 | 100 | 0 | 18 | 33 |
| 8O | 700 | 200 | 0.4 | 13 | 12 |
| 8P | 700 | 300 | 9.1 | 16 | 12 |

As set forth Table 9, the addition of AMINOSOAP® AR-12 reduces the static etch rate of molybdenum at all hydrogen peroxide concentrations.

Example 10

This example demonstrates the effectiveness of the inventive compositions to polish molybdenum. Molybdenum polishing rates were evaluated in this example for two polishing compositions. Each composition included 800 ppm by weight arginine, 500 ppm by weight histidine, 500 ppm by weight of Sinonate 1105SF anionic surfactant, 0.3 weight percent of ferric nitrate nonahydrate ($Fe(NO_3)_3 \cdot 9H_2O$), and 0.33 weight percent malonic acid, 0.5 weight percent anionic colloidal silica, and 0.1 weight percent hydrogen peroxide at pH 2.3. Composition 9B further included 100 ppm AMINOSOAP® AR-12 amino acid surfactant.

Molybdenum static etch rates were determined using the procedure described above in Example 7. The molybdenum, TEOS, and TiN polishing rates were obtained by polishing wafers containing blanket molybdenum, TEOS, and TiN layers. The wafers were polished using a Mirra® CMP polishing tool and a NexPlanar E6088 polishing pad at a downforce of 2.0 psi, a platen speed of 93 rpm, and a head speed of 87 rpm. The slurry flow rate was 100 ml/min. The results are shown in Table 10.

TABLE 10

| Polishing Composition | Mo SER (Å/min) | Mo RR Å/min | TEOS RR Å/min | TiN RR Å/min |
|---|---|---|---|---|
| 10A | 62 | 1151 | 36 | 143 |
| 10B | 10 | 1079 | 42 | 175 |

As set forth in Table 10, the addition of AMINOSOAP® AR-12 amino acid surfactant to a composition including an anionic surfactant and an amino acid was observed to significantly reduce the molybdenum static etch rate without significantly reducing the blanket molybdenum polishing rate.

Example 11

This example demonstrates the effectiveness of the inventive compositions at reducing the static and dynamic etch rates of tungsten. Four compositions were evaluated (examples 11A, 11B, 11C, and 11D). Each composition included 0.3 weight percent of ferric nitrate nonahydrate ($Fe(NO_3)_3 \cdot 9H_2O$), 0.33 weight percent malonic acid, 0.13 weight percent anionic silica, and 2.0 weight percent hydrogen peroxide at pH 2.3. Compositions 11B, 11C, and 11D further included 1300 ppm by weight arginine. Compositions 11A, 11C, and 11D further included 500 ppm by weight of Sinonate 1105SF anionic surfactant. Composition 11D further included 100 ppm by weight of AMINOSOAP® AR-12 amino acid surfactant. The levels of arginine, Sinonate 1105SF, and AMINOSOAP® AR-12 are listed in table 11.

The SER and DER of tungsten were determined as described above in Example 7 with the exception that the 2-inch wafer included a tungsten layer. The static etch rates were determined at 45 degrees C. and 65 degrees C. The dynamic etch rates were determined at 45 degrees C. and 55 degrees C. The etch rates are also listed in table 11.

TABLE 11

| Composition | Arginine (ppm) | 1105SF (ppm) | AR-12 (ppm) | SER 45C (Å/min) | SER 65C (Å/min) | DER 45C (Å/min) | DER 55C (Å/min) |
|---|---|---|---|---|---|---|---|
| 11A | 0 | 500 | 0 | 167 | 601 | 172 | 264 |
| 11B | 1300 | 0 | 0 | 30 | 74 | 26 | 45 |
| 11C | 1300 | 500 | 0 | 18 | 29 | 5 | 9 |
| 11D | 1300 | 500 | 100 | 25 | 74 | 4 | 15 |

As set forth in Table 11, compositions including an amino acid (arginine in this example), an anionic surfactant, and an optional amino acid surfactant (compositions 11C and 11D) were observed to have reduced static rates of tungsten and significantly reduced dynamic etch rates of tungsten as compared to the compositions including only amino acid or anionic surfactant.

Example 12

This example demonstrates the effectiveness of the inventive compositions at polishing patterned tungsten wafers. Two inventive compositions were evaluated (examples 12A and 12B). Each composition included 0.3 weight percent of ferric nitrate nonahydrate ($Fe(NO_3)_3 \cdot 9H_2O$), 0.43 weight percent (12A) and 0.33 weight percent (12B) malonic acid, 800 ppm by weight arginine, 500 ppm by weight histidine, 500 ppm by weight Sinonate 1105SF, 0.13 weight percent anionic silica, and 0.1 weight percent hydrogen peroxide at pH 2 (12A) and 2.3 (12B). Composition 12B further included 200 ppm by weight of AMINOSOAP® AR-12 amino acid surfactant. Various composition details are listed in Table 12A.

Blanket tungsten and TEOS wafers and patterned tungsten W wafers were polished using a Mirra® CMP polishing tool and a NexPlanar E6088 polishing pad at a downforce of 2.0 psi, a platen speed of 93 rpm, and a head speed of 87 rpm. The slurry flow rate was 100 ml/min. The patterned tungsten wafers had been previously polished to endpoint and had similar incoming topography. Each patterned tungsten wafer was polished for 45 seconds.

Blanket tungsten and TEOS polishing rates are listed in Table 12A. Dishing and erosion results are listed in Tables 12B and 12C. The dishing results are listed for 1 µm, 10 µm, 50 µm, and 100 µm tungsten lines. The erosion results are listed for 0.18×0.18 µm, 1×1 µm, 10×10 µm, 50×50 µm, and 100×100 µm arrays.

TABLE 12A

| Composition | Amino Acid (ppm) | 1105SF (ppm) | AR-12 (ppm) | W RR (Å/min) | TEOS RR (Å/min) |
|---|---|---|---|---|---|
| 12A | 800 Arginine 500 Histidine | 500 | 0 | 540 | 24 |
| 12B | 800 Arginine 500 Histidine | 500 | 100 | 456 | 26 |

TABLE 12B

| | Tungsten Dishing (Å) | | | | | | | |
|---|---|---|---|---|---|---|---|---|
| | Downforce - 1 psi | | | | Downforce - 2 psi | | | |
| Composition | 1 μm | 10 μm | 50 μm | 100 μm | 1 μm | 10 μm | 50 μm | 100 μm |
| 12A | 31 | 90 | 126 | 145 | 52 | 113 | 180 | 213 |
| 12B | 52 | 29 | 69 | 82 | 37 | 62 | 144 | 164 |

TABLE 12C

| | Array Erosion (Å) | | | | | | | | | |
|---|---|---|---|---|---|---|---|---|---|---|
| | Downforce - 1 psi | | | | | Downforce - 2 psi | | | | |
| Composition | 0.18 × 0.18 | 1 × 1 | 10 × 10 | 50 × 50 | 100 × 100 | 0.18 × 0.18 | 1 × 1 | 10 × 10 | 50 × 50 | 100 × 100 |
| 12A | 240 | 66 | −33 | 19 | −18 | 27 | 13 | 28 | 16 | 11 |
| 12B | 134 | 62 | 23 | −6 | 20 | 41 | 36 | 31 | 19 | 1 |

As set forth in Tables 12A-12C, composition including 200 ppm AMINOSOAP® AR-12 amino acid surfactant achieves superior dishing and superior array erosion in patterned tungsten wafers across a wide range of feature sizes at both 1 psi and 2 psi downforce. Moreover, this significantly improved pattern wafer performance was achieved with only a minimal decrease in tungsten removal rate (about 15%).

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical mechanical polishing composition comprising:
   a water based liquid carrier;
   abrasive particles dispersed in the liquid carrier;
   an amino acid selected from the group consisting of arginine, histidine, cysteine, lysine, and mixtures thereof;
   an amino acid surfactant; and
   an anionic polymer or an anionic surfactant, wherein the anionic polymer is selected from the group consisting of polysulfonic acids, polyacrylic acids, and polyphosphoric acids, and further comprising:
   an iron-containing accelerator from about 20 to about 2000 ppm Fe at point of use; and a stabilizer bound to the iron-containing accelerator, wherein the stabilizer comprises phosphoric acid, acetic acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid EDTA), propylenediaminetetraacetic acid (PDTA), and mixtures thereof.

2. The composition of claim 1, further comprising a hydrogen peroxide oxidizer.

3. The composition of claim 1, wherein the anionic polymer is a polysulfonic acid polymer selected from the group consisting of polyvinyl sulfonic acid, polystyrene sulfonic acid, poly(2-acrylamido-2-methylpropane sulfonic acid), poly(styrenesulfonic acid-co-maleic acid), and mixtures thereof.

4. The composition of claim 3, wherein the anionic polymer is polyvinyl sulfonic acid (PVSA) or polystyrenesulfonic acid (PSSA).

5. The composition of claim 4, wherein the amino acid is selected from the group consisting of arginine, histidine, and mixtures thereof.

6. The composition of claim 1, wherein the anionic surfactant comprises an alkyl group and a negative charged sulfate or sulfonate group.

7. The composition of claim 1, wherein the anionic surfactant is selected from the group consisting of disodium hexadecyldiphenyloxide disulfonate, ammonium lauryl polyoxyethylene ether sulfate, ammonium polyoxyethylene styrenated aryl sulfate, and combinations thereof.

8. The composition of claim 1 wherein the abrasive particles comprise anionic silica or anionic alumina.

9. The composition of claim 1, wherein the amino acid surfactant comprises an amino acid group selected from the group consisting of glycine, alanine, arginine, histidine, lysine, aspartic acid, and glutamic acid.

10. The composition of claim 1, wherein the amino acid surfactant comprises Triethanolamine N-Cocoyl-DL-alaninate, L-Arginine Cocoate, Glycine, N-methyl-N-(1-oxododecyl), and mixtures thereof.

11. The composition of claim 1, comprising from about 100 ppm by weight to about 1000 ppm by weight of the anionic surfactant and about 30 ppm by weight to about 300 ppm by weight of the amino acid surfactant.

12. The composition of claim 1, wherein:
    the abrasive particles comprise anionic silica or anionic alumina;
    the amino acid is selected from the group consisting of arginine, histidine, and mixtures thereof; and
    the anionic polymer or the anionic surfactant comprises an anionic surfactant including an alkyl group and a negative charged sulfate or sulfonate group.

13. The composition of claim 12, wherein the amino acid surfactant includes an amino acid group selected from the group consisting of glycine, alanine, arginine, histidine, lysine, aspartic acid, and glutamic acid.

* * * * *